(12) United States Patent
Bono et al.

(10) Patent No.: US 9,444,010 B2
(45) Date of Patent: Sep. 13, 2016

(54) PROCESS FOR FORMING LIGHT-EMITTING DIODES

(71) Applicant: Commissariat à l'énergie atomique et aux énergies alternatives, Paris (FR)

(72) Inventors: Hubert Bono, Grenoble (FR); Bernard Andre, Quaix ex Chartreuse (FR); Adrien Gasse, Seyssins (FR)

(73) Assignee: Commissariat a l'energie atomique et aux energies alternatives (FR)

( * ) Notice: Subject to any disclaimer, the term of this patent is extended or adjusted under 35 U.S.C. 154(b) by 0 days.

(21) Appl. No.: 14/776,562

(22) PCT Filed: Mar. 14, 2014

(86) PCT No.: PCT/FR2014/050602
§ 371 (c)(1),
(2) Date: Jan. 5, 2016

(87) PCT Pub. No.: WO2014/140505
PCT Pub. Date: Sep. 18, 2014

(65) Prior Publication Data
US 2016/0155900 A1    Jun. 2, 2016

(30) Foreign Application Priority Data
Mar. 14, 2013  (FR) ...................... 13 52275

(51) Int. Cl.
| H01L 21/00 | (2006.01) |
| H01L 33/32 | (2010.01) |
| H01L 33/46 | (2010.01) |
| H01L 33/50 | (2010.01) |
| H01L 33/08 | (2010.01) |
| H01L 33/64 | (2010.01) |

(52) U.S. Cl.
CPC ............... *H01L 33/32* (2013.01); *H01L 33/08* (2013.01); *H01L 33/46* (2013.01); *H01L 33/502* (2013.01);
(Continued)

(58) Field of Classification Search
CPC ..... H01L 33/32; H01L 33/46; H01L 33/502; H01L 33/08; H01L 33/641
See application file for complete search history.

(56) References Cited

U.S. PATENT DOCUMENTS 8,946,742 B2 * 2/2015 Yu ...................... H01L 23/481
  257/98
2006/0214178 A1   9/2006 Choi et al.
(Continued)

FOREIGN PATENT DOCUMENTS

WO    2008098832 A1   8/2008
WO    2009121314 A1   10/2009
(Continued)

OTHER PUBLICATIONS

"International Preliminary Report on Patentability", dated Sep. 15, 2015 issued in International Application No. PCT/FR2014/050602.
(Continued)

*Primary Examiner* — Richard Booth
(74) *Attorney, Agent, or Firm* — Kaplan Breyer Schwarz & Ottesen LLP

(57) ABSTRACT

The invention relates to a process for manufacturing light-emitting diodes comprising the following steps: a) forming light-emitting diodes (5) on a silicon layer (1) of an SOI wafer (1, 2, 3), said layer resting on a carrier (2, 3); b) bonding, on the light-emitting diode side, a silicon wafer forming a cap (7) equipped with a void facing each light-emitting diode; c) thinning the silicon wafer to form an aperture facing each light-emitting diode; d) filling each aperture with a transparent material (21, 23); and e) at least partially removing the carrier of the SOI wafer (3) and producing connecting and heat-sinking metallizations.

11 Claims, 5 Drawing Sheets

(52) U.S. Cl.
CPC ..... *H01L 33/641* (2013.01); *H01L 2933/0025* (2013.01); *H01L 2933/0033* (2013.01); *H01L 2933/0041* (2013.01); *H01L 2933/0075* (2013.01)

(56) References Cited

U.S. PATENT DOCUMENTS

| | | |
|---|---|---|
| 2008/0179606 A1 | 7/2008 | Usuda et al. |
| 2012/0187432 A1* | 7/2012 | Kawaguchi ........... H01L 33/486 257/98 |

FOREIGN PATENT DOCUMENTS

| | | |
|---|---|---|
| WO | 2009156354 A1 | 12/2009 |
| WO | 2012075461 A1 | 6/2012 |

OTHER PUBLICATIONS

"International Search Report", dated Jul. 2, 2014, issued in counterpart International Application No. PCT/FR2014/050602.

* cited by examiner

PROCESS FOR FORMING LIGHT-EMITTING DIODES

The present patent application claims the priority benefit of French patent application FR13/52275 which is herein incorporated by reference.

BACKGROUND

The present disclosure relates to the manufacturing of light-emitting diodes and more specifically to a method of encapsulating light-emitting diodes.

DISCUSSION OF THE RELATED ART

Generally, light-emitting diodes are manufactured on substrates and then cut into individual chips before being assembled on supports.

Document US 2006/0214178 describes a method of manufacturing, encapsulating, and assembling light-emitting diodes.

Various known methods of manufacturing, encapsulating, and assembling light-emitting diodes imply implementing a very large number of steps, some of which are complex, particularly implying chip transfers and the provision of multiple handles.

SUMMARY

It is here aimed at providing a collective light-emitting diode manufacturing and encapsulation method which is particularly simple to implement and which enables the assembly of light-emitting diodes to be performed in optimal heat dissipation conditions.

Thus, an embodiment provides a method of manufacturing light-emitting diodes comprising the steps of:

a) forming light-emitting diodes on a silicon layer of an SOI-type wafer, said layer resting on a support;

b) bonding on the light-emitting diodes side a silicon wafer forming a cap provided with a recess opposite each light-emitting diode;

c) leveling down the silicon wafer to form an opening opposite each light-emitting diode;

d) filling each opening with a transparent material; and e) at least partially removing the support of the SOI-type wafer and forming connection and heat sink metallizations.

According to an embodiment, at least the removal of the support of the SOI-type wafer of step e) is carried out before steps c) and d).

According to an embodiment, steps c), d), and e) follow one another.

According to an embodiment, the method further comprises a step of cutting into individual light-emitting diodes or into groups of light-emitting diodes.

According to an embodiment, the lateral surfaces of each recess of the silicon wafer forming a cap are coated with a reflective deposit.

According to an embodiment, the light-emitting diodes are nanowire light-emitting diodes.

According to an embodiment, the nanowires are GaN nanowires.

According to an embodiment, the nanowires are formed from a seed layer deposited on the silicon layer.

According to an embodiment, the filling of the openings is performed with a transparent material provided with phosphors in its portion close to the light-emitting diodes.

According to an embodiment, the external surface of the filling material is shaped to have desired optical characteristics.

BRIEF DESCRIPTION OF THE DRAWINGS

The foregoing and other features and advantages will be discussed in detail in the following non-limiting description of specific embodiments in connection with the accompanying drawings, among which.

For clarity, the same elements have been designated with the same reference numerals in the various drawings and, further, as usual in the representation of integrated circuits, the various drawings are not to scale.

DETAILED DESCRIPTION

Figure 1:
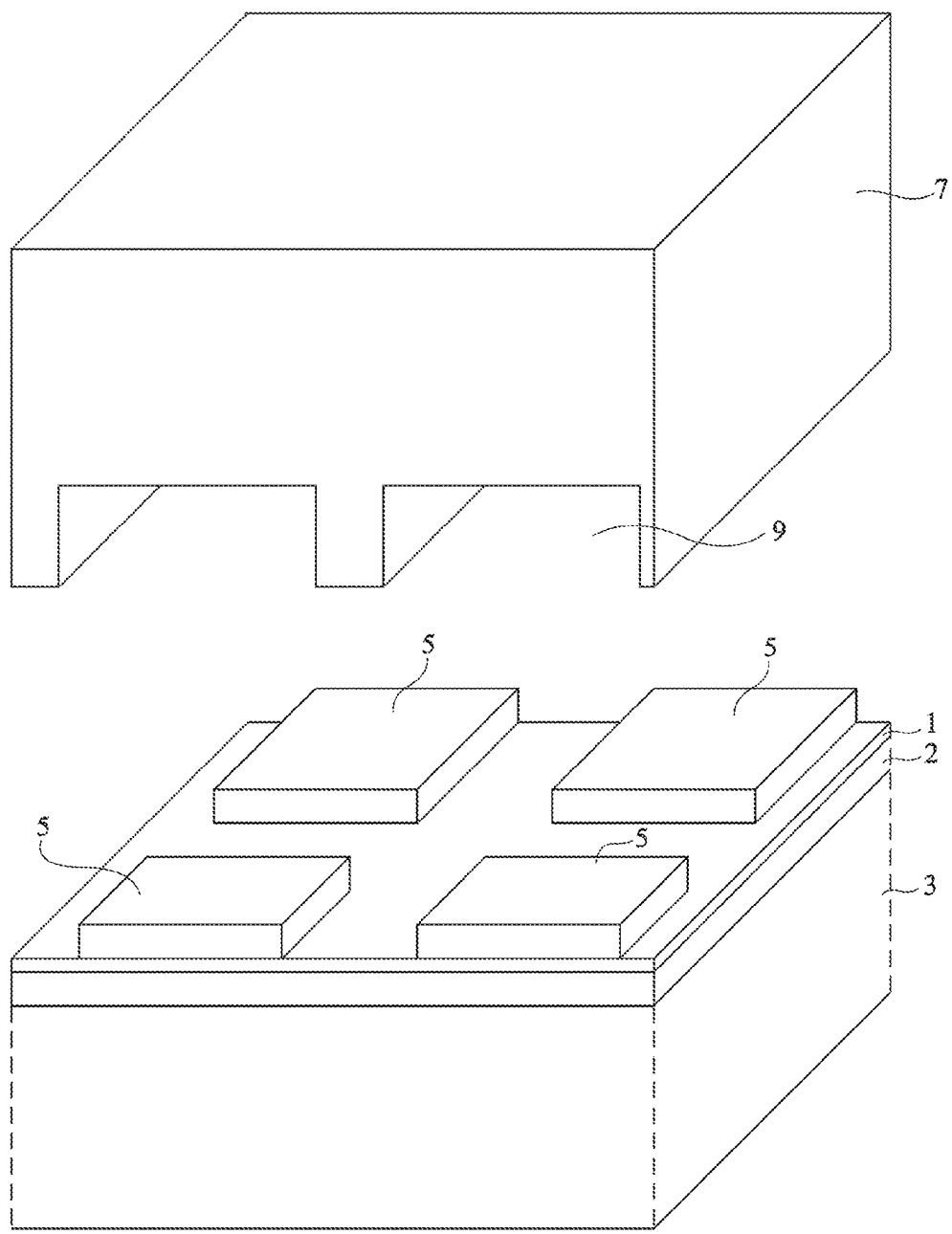
FIG. 1 is an exploded perspective view of an intermediate step of a collective light-emitting diode forming method.

FIG. 1 is an exploded perspective view of an intermediate step of a collective light-emitting diode forming an encapsulation method such as provided herein. The light-emitting diodes are manufactured on a SOI-type wafer comprising a thin silicon layer 1, capable of being electrically conductive, arranged on a support of different physical or chemical nature. In the most current case, currently, the support comprises an insulating layer 2, currently, a silicon oxide layer, itself formed on a handle 3, for example corresponding to a silicon wafer. Silicon layer 1 rests on insulating layer 2.

It should however be noted that what will be here called "SOI-type wafer" generally designates a thin silicon layer, currently having a thickness in the range from 10 nm to 10 μm, resting on a support of different nature, preferably an insulating support. The support may be one piece and directly behave as a handle or may correspond to a multilayer structure comprising an insulating layer resting on a handle, which may be non-insulating.

On thin silicon layer 1, four light-emitting diodes 5 capable of emitting light upwards have been schematically shown. Reference 7 designates a cap, preferably formed of a silicon wafer, this cap being provided with recesses 9. This cap is intended to be assembled on the SOI-type wafer so that each light-emitting diode 5 is located opposite a recess 9.

It should be noted that an advantage of using an SOI wafer based on silicon and a silicon-based cap is that problems of differential thermal expansion between the two elements are thus avoided.

FIG. 1 is intended to enhance the fact that the method described herein is a collective method. A specific embodiment of the method provided herein will now be described in further detail in relation with the cross-section views of FIGS. 2 to 8, which illustrate successive steps of implementation of an embodiment of the method. Each of the cross-section views is a partial view illustrating the forming of a single light-emitting diode. The example of light-emitting diodes formed from nanowires, for example, GaN nanowires, will be taken herein. However, any type of light-emitting diode may be used.

Figure 2:
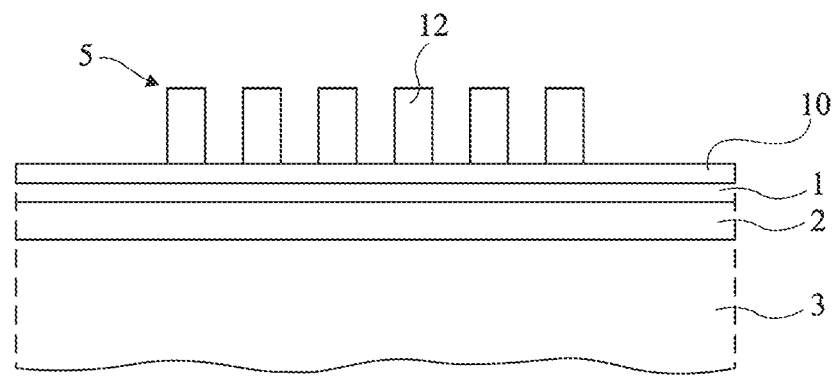
FIGS. 2 to 8 are simplified cross-section views illustrating successive steps of an example of an embodiment of a collective light-emitting diode manufacturing method.

The cross-section view of FIG. 2 shows the SOI-type wafer comprising thin silicon layer 1, silicon oxide layer 2, and silicon handle 3. On thin silicon layer 1, a seed layer 10, for example, a layer of AlN or of any other adapted material, has been deposited, in the case where GaN nanowires are desired to be grown. After this, a masking (not shown) has been carried out, or any other adapted method has been implemented, to grow GaN nanowires 12 in selected areas, currently according to a checkerboard pattern.

Conventionally, each nanowire 12 may be covered with an active layer comprising, for example, a multiple quantum well structure, and the active layers may be covered with a transparent electrode. In FIGS. 2 to 7, the active layers and the electrodes of light-emitting diodes 5 are not shown.

Figure 3:
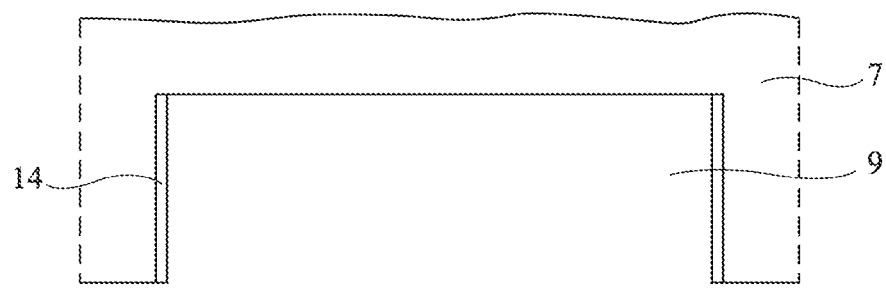

FIG. 3 shows a portion of a cap 7 formed in a silicon wafer of same diameter as the SOI-type wafer. This cap comprises recesses 9, each being intended to cover a light-emitting diode 5. Preferably, the lateral surfaces of recesses 9 are coated with a reflective layer 14, for example, an aluminum layer. To form this aluminum layer on the recess walls, a full plate deposition of aluminum followed with an anisotropic plasma etching which leaves in place aluminum on the lateral surfaces may be performed. Recesses 9 are non-through.

Figure 4:
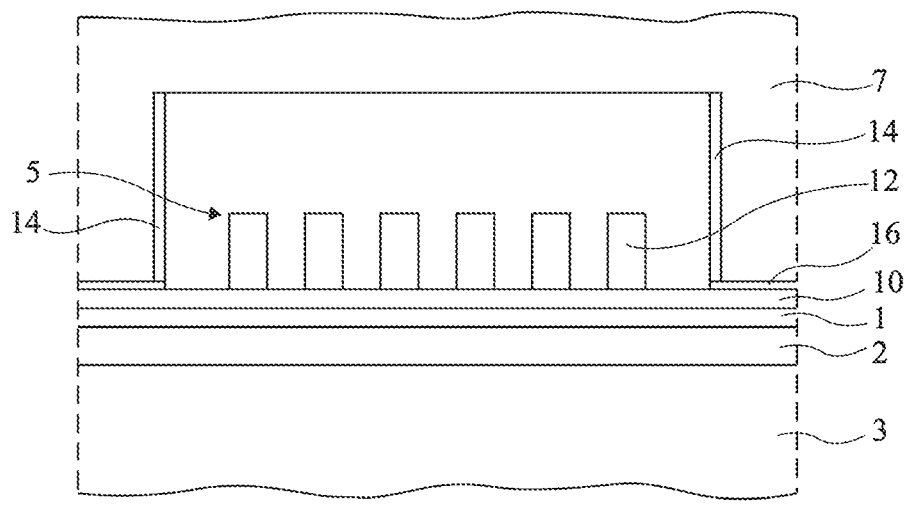

At the next step, illustrated in FIG. 4, cap 7 is installed. It is bonded to the upper surface of the SOI wafer by any means, for example, by soldering, by using a layer of glue 16, or also by molecular bonding or optical bonding. In this last case, it may be provided to previously form thin silicon oxide layers on the surfaces intended to come into contact.

Figure 5:
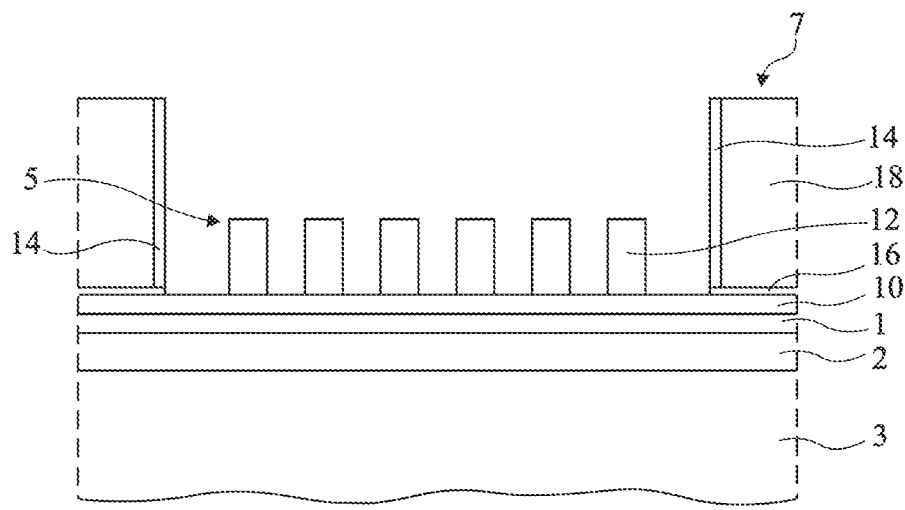

FIG. 5 illustrates a next step, in the context of a first alternative embodiment where the upper portion of cap 7 is leveled down at this stage so that the light-emitting diodes are exposed and that there remain walls (a meshing) 18 of cap 7 between the light-emitting diodes.

Figure 6:
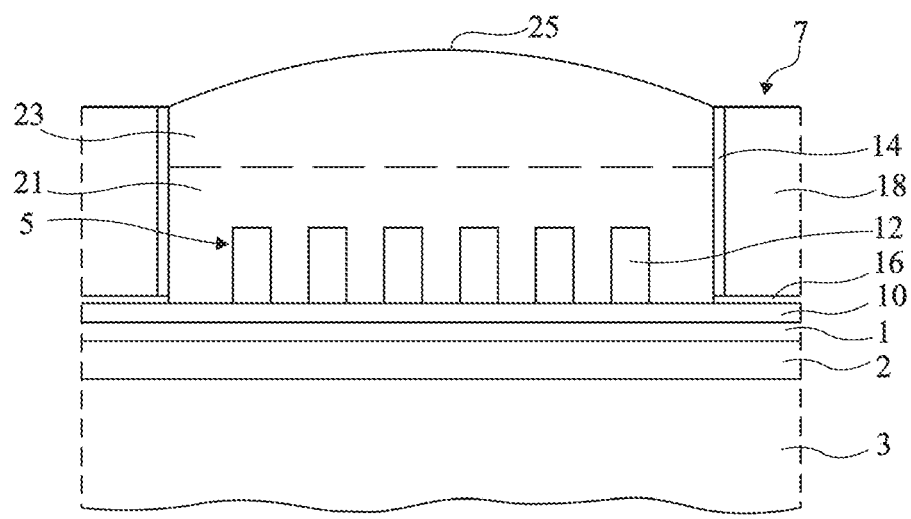

At the step illustrated in FIG. 6, the openings formed in the down-leveled cap have been filled with a product capable of protecting the light-emitting diodes and of ensuring their fine operation. For example, a first filling with a transparent material 21 containing a phosphor followed by a second filling with a transparent material 23 may be carried out. The transparent material is for example silicon. Layers 21 and 23 may be one and the same and may be formed of an encapsulator containing phosphors. Upper surface 25 is shaped in desired fashion, for example, as a lens. It may also be provided for this upper surface to be planar or to be in the form of a Fresnel lens.

Figure 7:
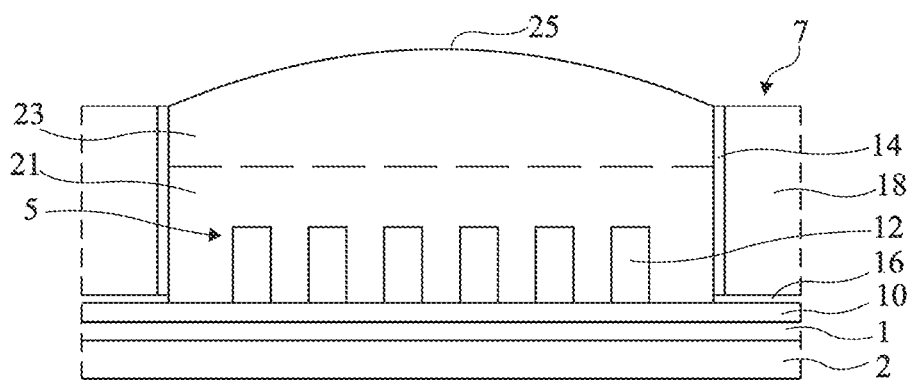

Then, at the step illustrated in FIG. 7, handle 3 has been removed from the SOI wafer. Then, the lower layer in FIG. 7 is silicon oxide layer 2, in the example described herein. After this step, the mechanical hold of the remaining wafer is ensured by meshing 18 of the remaining portions of cap 7. The removal of handle 3 may be carried out by any type of etching, silicon oxide layer 2 being capable of playing the role of an etch stop layer. The removal of handle 3 is preferably carried out on the entire SOI wafer.

Figure 8:
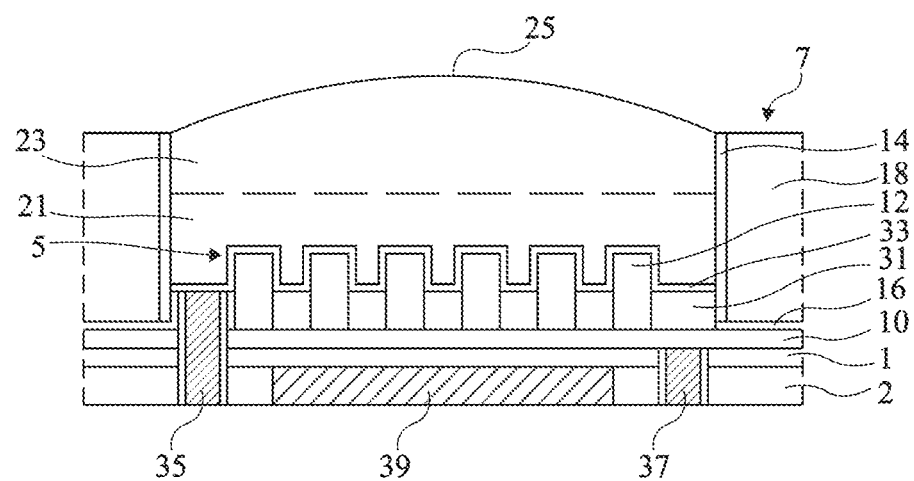

FIG. 8 shows in further detail the structure of nanowire light-emitting diodes. It has been shown that the bottom of the nanowires is surrounded with an insulating layer 31 and that the entire nanowire structure is covered with a transparent conductive layer 33. Of course, layers 31 and 33 will have been formed from as soon as the manufacturing of the nanowires illustrated in FIG. 2, before cap 7 is installed. A first via or rather a set of first vias 35 comes into contact with transparent conductive layer 33 through layers 2, 1, 10, and 31. A second via or rather a set of second vias 37 comes into contact with conductive layer 10 having the nanowires resting thereon. The connection of the light-emitting diodes is thus ensured. It should be noted that via 35 should be an insulated via. Via 37 has also been shown as an insulated via since it is simpler to manufacture it similarly to via 35. However, via 37 is not necessarily insulated since it can without inconvenience be in contact with thin silicon layer 1, which may be electrically conductive. Finally, a recess has been formed in silicon oxide layer 2 under the light-emitting diode. This recess is partially or totally filled with a metal layer 39 used as a heat sink, intended to be placed in contact with a radiator on assembly of the light-emitting diodes after their cutting into individual elements, or into groups of elements.

It should be noted that based on FIG. 5, a first variation where it is started by removing an upper portion of the cap to expose the light-emitting diodes has been described. According to a second variation, it is started by the steps of removing handle 3 of the SOI wafer. One or the other of the two variations will be selected according to practical conveniences and according to the thicknesses of the various supports to ascertain that enough material always remains in place to ensure the mechanical hold and the workability of the assembly.

It should be noted that the method described hereabove has many advantages:

1. The method solves thermal problems associated with light-emitting diodes in that the bottom of each light-emitting diode (the non-emitting side) rests on a thin silicon layer originating from an SOI-type wafer and thus has a very small thickness. This thin silicon layer is coated with a heat sink promoting heat dissipation. Further, this method provides light-emitting diodes with well-reproducible thermal characteristics, the thickness of the thin silicon layer of an SOI-type wafer being constant and reproducible.

2. The method is implemented by only using two wafers and no intermediate handle. It is then particularly simple to implement, handlings being always easy.

3. The entire manufacturing results from a collective method. Only at the end, once the light-emitting diodes have been formed and encapsulated and the contacts and the heat sinks have been placed, is the structure cut into individual light-emitting diodes (or in small groups of light-emitting diodes).

4. The fact for recesses 9 to be non-through advantageously enables to keep for cap 7 a sufficient mechanical stiffness on handling and bonding thereof. The steps of handling cap 7 are thus simplified. In particular, the cap stiffness is increased with respect to a cap comprising openings before attaching the cap to the SOI wafer, particularly as is the case for the device described in document US 2006/0214178.

5. The greater stiffness of cap 7 enables to increase the lateral dimensions of recesses 9, in a plane parallel to thin layer 1, with respect to the lateral dimensions of cap 7, and particularly to provide a cap 7 for which the ratio of the surface area of the openings in a plane parallel to thin layer 1 to the cap surface area is greater than or equal to 0.6, preferably 0.7, more preferably 0.8. This advantageously enables to increase the surface area of the SOI-type wafer used to form light-emitting diodes with respect to a device where the cap, before bonding to the SOI wafer, is provided with through openings and for which, to maintain a sufficient mechanical hold, the ratio of the surface area of the openings, in a plane parallel to the upper surface of the SOI wafer, to the cap surface area is smaller than 0.3, as for the device described in document US 2006/0214178.

6. The fact for handle 3 to be removed from the entire SOI wafer and not, for example, only at the level of the light-emitting diodes, as for example for the structure described in document US 2006/0214178, enables to avoid the occurrence of stress due to the difference in expansion coefficients between the material forming the handle and the materials of elements subsequently deposited on the handle.

It will be within the abilities of those skilled in the art to select the natures and thicknesses of the various elements described herein so that they satisfy the described functions. As an example only, the following choices may be made.

Thin silicon layer 1: thickness in the range from 100 nm to 10 µm.

Insulating layer 2: dielectric layer or multilayer, preferably a good heat conductor. One can non-exhaustively mention: silicon oxide, silicon nitride, silicon carbide, aluminum nitride, or boron nitride, etc. . . . . Layer 2 may have a thickness in the range from 50 nm to 10 µm.

Silicon wafer 3: thickness in the range from 300 to 800 µm, according to the diameter thereof.

Cap 7: thickness in the range from 300 to 800 µm, according to the diameter thereof.

Recesses 9: depth in the range from 200 to 600 µm (sufficient for the height of walls 18 remaining after leveling down of cap 7 to ensure the mechanical hold after removal of handle 3).

Seed layer 10: for example, a layer of AlN or of any other adapted metal or compound, having a thickness in the range from 50 to 500 nm.

Nanowires 12: GaN nanowires having height in the range from 1 to 500 µm, currently from 5 to 20 µm.

Lateral dimensions of the light-emitting diodes: from 0.1 to 5 mm. Further, these diodes may be interconnected either in parallel to ensure the redundancy, or in series to adjust the operating voltage.

The invention claimed is:

1. A light-emitting diode manufacturing method comprising the steps of:
    a) forming light-emitting diodes on a silicon layer of an SOI-type wafer, said layer resting on a support;
    b) bonding on the light-emitting diode side a silicon wafer forming a cap provided with a non-through recess opposite each light-emitting diode;
    c) leveling down the bonded silicon wafer to form a through opening opposite each light-emitting diode;
    d) filling each opening with a transparent material; and
    e) at least partially removing the support of the SOI-type wafer from the entire SOI-type wafer and forming connection and heat sink metallizations.

2. The method of claim 1, wherein steps c), d), and e) follow one another.

3. The method of claim 1, wherein at least the removal of the support of the SOI-type wafer of step e) is carried out before steps c) and d).

4. The method of claim 1, further comprising a step of cutting into individual light-emitting diodes or into groups of light-emitting diodes.

5. The method of claim 1, wherein the lateral surfaces of each recess of the silicon wafer forming a cap are coated with a reflective deposit.

6. The method of claim 1, wherein the light-emitting diodes are nanowire light-emitting diodes.

7. The method of claim 6, wherein the nanowires are GaN nanowires.

8. The method of claim 7, wherein the nanowires are formed from a seed layer deposited on the silicon layer.

9. The method of claim 1, wherein the filling of the openings is performed with a transparent material provided with phosphors in its portion close to the light-emitting diodes.

10. The method of claim 1, wherein the external surface of the filling material is shaped to have desired optical characteristics.

11. The method of claim 1, wherein the support of the SOI-type wafer comprises a handle and an insulating layer interposed between the handle and the silicon layer and wherein, at step (e), the handle is totally removed.

* * * * *